United States Patent
Tang et al.

(10) Patent No.: US 7,096,166 B2
(45) Date of Patent: Aug. 22, 2006

(54) METHOD OF MODELING MUSCULAR TISSUE WITH ACTIVE FINITE ELEMENTS

(75) Inventors: Chak Yin Tang, Kowloon (HK); Chi Pong Tsui, Kowloon (HK)

(73) Assignee: The Hong Kong Polytechnic University, Kowloon (HK)

( * ) Notice: Subject to any disclaimer, the term of this patent is extended or adjusted under 35 U.S.C. 154(b) by 880 days.

(21) Appl. No.: 10/051,296

(22) Filed: Jan. 22, 2002

(65) Prior Publication Data

US 2003/0139911 A1   Jul. 24, 2003

(51) Int. Cl.
  *G06F 17/10* (2006.01)
(52) U.S. Cl. .......................................... 703/2
(58) Field of Classification Search ............... 703/2, 703/7, 9; 702/34
See application file for complete search history.

(56) References Cited

U.S. PATENT DOCUMENTS

| | | | | |
|---|---|---|---|---|
| 5,210,704 A | * | 5/1993 | Husseiny | 702/34 |
| 5,377,119 A | * | 12/1994 | Backer et al. | 700/146 |
| 5,531,122 A | * | 7/1996 | Chatham et al. | 73/760 |
| 6,708,141 B1 | * | 3/2004 | Schaff et al. | 703/2 |

FOREIGN PATENT DOCUMENTS

JP      0200102546 A   *   1/2001

\* cited by examiner

*Primary Examiner*—Albert W. Paladini
(74) *Attorney, Agent, or Firm*—Leydig, Voit & Mayer, Ltd.

(57) ABSTRACT

A method of modeling muscular tissue with active finite elements. The motion and stress-strain distribution of the muscular tissue can be predicted using interconnections of the active finite elements. Each active finite element includes a motor element and at least one passive element, such as a dashpot or spring.

5 Claims, 3 Drawing Sheets

METHOD OF MODELING MUSCULAR TISSUE WITH ACTIVE FINITE ELEMENTS

BACKGROUND OF THE INVENTION

The present invention pertains to a method of creating active finite elements for studying mechanical properties of active structures. One of the applications is to study the mechanical properties of skeletal muscles, which is important to industrial design of sport, automotive, medical and health equipment for exercise, rehabilitation and treatments, for example.

The basic ideas of the finite element method are presented in a paper "Stiffness and Deflection Analysis of Complex Structures" in 1956. In 1960, the name "finite element" was coined by R. W. Clough in a paper "The Finite Element Method in Plane Stress Analysis" on plane elasticity problems. The finite element method uses numerical analysis to obtain approximate solutions for solving various engineering problems. A structure or region to be analized is broken down into many small and interconnected subregions. These subregions are called finite elements.

Traditionally, the finite element method has been frequently used in design processes in civil, mechanical and aeronautical engineering. Recently, the finite element method has been successfully extended to solve other types of engineering problem, like geomechanics, acoustics, electromagnetic fields, field dynamics and heat transfer. Some attention has also been given to the micro- and macro-analyses of advanced composite materials.

In stress/displacement finite element analyses, external conditions such as boundary conditions and loads can be prescribed on nodes, element faces and element bodies. Boundary conditions generally include prescribed displacement, prescribed velocity and prescribed acceleration. Loads can include concentrated forces, surface tractions, moments, and body forces due to centrifugal acceleration, rotary acceleration, and gravity. When all nodes in a node set are prescribed a displacement in certain degrees of freedom, these nodes will displace from their original positions in the prescribed direction after a specified time period. When a surface traction such as pressure force is applied onto the surface of an element set, these elements may deform, displace or rotate. Thus, if no appropriate external conditions are prescribed on them, any nodes or elements are passive and do not have any motion.

However, some structures like skeletal muscle are active in nature. Whenever there is an electrical stimulation applied to skeletal muscle, the muscle can contract under no prescribed externally applied displacement and load. As material properties of current finite elements are limited to be passive, simulation of active structures and the interactions with passive ones are almost impossible to perform. Thus, the foregoing calls for a novel method to model the mechanical properties of active structures like human beings, animals, and smart structures.

OBJECTS OF THE INVENTION

It is an object of the present invention to devise a method of creating active finite elements for studying mechanical properties of active structures.

DISCLOSURE OF THE INVENTION

There are disclosed herein a method for creating and analyzing active finite elements comprising the steps of:

a) constructing the active finite elements with a combinations of motor elements, dashpot elements and spring elements,
b) defining the motor element using a time series function, and
c) constructing a model with the active finite elements, and
d) analyzing the model using a finite element code.

Preferably, the finite element code is a conventional code.
Preferably, said finite elements are one-dimensional or two-dimensional or three-dimensional.

Under no applied external conditions like prescribed boundary conditions and loads, active finite elements can be activated to displace, rotate or deform by the prescribed time series function.

Each active finite element must consist of at least one motor element. The composition of an active finite element can be any combinations of motor element(s), dashpot element(s) and/or spring element(s).

The time series function pre-describes the strain and/or its rates of the material of the motor element By incorporating this function into the stress-strain relation, the motor element can be created to construct the active finite element.

Active structures include but are not limited to human beings, animals and smart structures.

BRIEF DESCRIPTION OF THE DRAWINGS

A preferred form of the invention will now be described by way of example with reference to the accompanying drawings, wherein.

DETAILED DESCRIPTION OF THE PREFERRED EMBODIMENT

An active finite element such as a muscle tissue 2 contains at least one motor element 10. Dashpot element(s) 11 and/or spring element(s) 12 with a suitable arrangement can be connected to the motor element to construct the active element. Each of these basic elements has their own properties. Even under no applied external conditions like prescribed boundary conditions and loads, motor elements can be activated to contract or expand by a time series function.

The time function governs the strain and its rates of the material of the motor element. The dashpot elements have viscous properties while spring elements are elastic or hyperelastic or hypoelastic. By suitable combinations of the motor elements, dashpots and springs, an active finite element can be designed to have different constitutive material properties for studying mechanical properties of various different types of active structure. Incorporating a user-defined sub-programme into a conventional finite element code creates the active finite element with desired material properties. One-dimensional, two-dimensional or three-dimensional finite element models are then built for active structures by using the created active finite elements. In addition, suitable finite element meshing, prescribed boundary conditions, load conditions and analysis steps should be defined for predicting the motion and stress-strain distribution of active structures.

EXAMPLE

Active Finite Elements for Biomechanical Studies

This example describes how a three-dimensional active finite element is created for biomechanical studies. The active finite element is then applied to model the motion of skeletal muscle tissue. The active finite element is created by incorporating a user-defined sub-programme into the finite element code ABAQUS version 5.8. The active finite element is controlled by a time function that may describe the neuromuscular characteristics.

Figure 1:
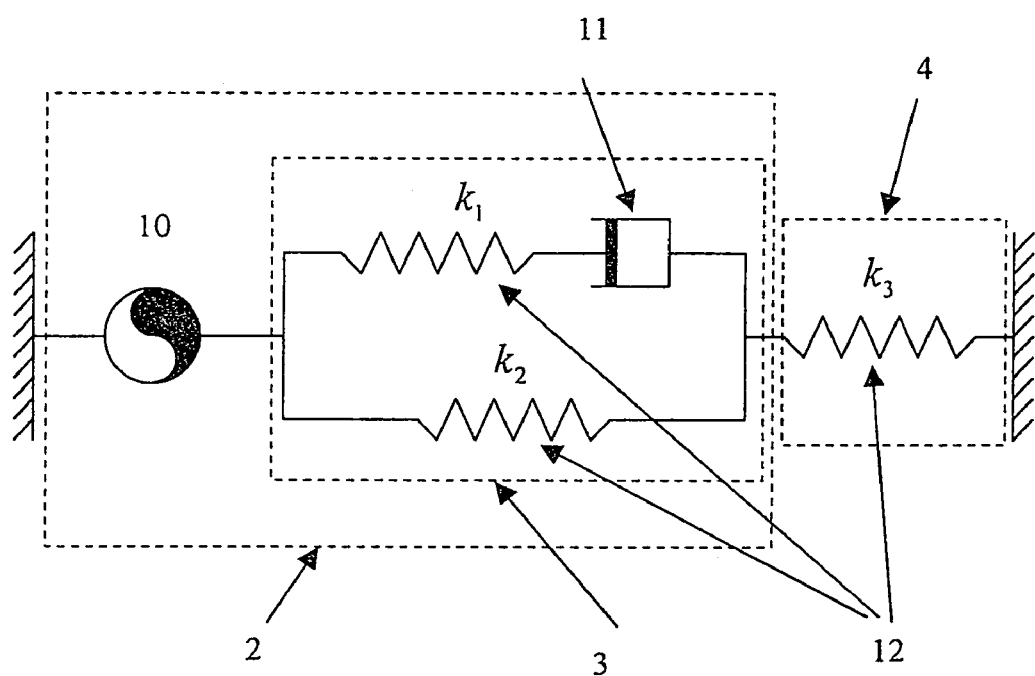
FIG. 1 is a one-dimensional representation of muscle-tendon complex.

One dimensional representation of a simple muscle-tendon complex is shown in FIG. 1. In this example, the active finite element 2 is constructed by one motor element 10, a combined viscoelastic element 3 including one dashpot element 11 and two spring elements 12($k_1$ & $k_2$). The tendon 4 is represented by a spring element 12 ($k_3$).

Suppose the strain, $\epsilon(t)$ of the motor element is represented by a linear time function:

$$\epsilon(t) = ct + c_0 \quad (1)$$

where c, $c_0$, t are the strain rate coefficient, the initial strain and the time variable respectively. For instance, $c_0$ is set to zero.

At a time, t, the rate of extension or contraction of the motor element can be controlled by the value of c. When c is positive, the motor element will elongate actively. On the other hand, the value of c is set to be negative, the motor element will shorten actively to produce contractile force.

For a three-dimensional motor element, the incremental stress-strain relationships in this example, are expressed as:

$$\Delta\sigma_{xx}(t) = \Delta\epsilon_{xx}(t) - c\Delta t \quad (2)$$

$$\Delta\sigma_{yy}(t) = \Delta\epsilon_{yy}(t) - c\Delta t + a \quad (3)$$

$$\Delta\sigma_{zz}(t) = \Delta\epsilon_{zz}(t) - c\Delta t + b \quad (4)$$

where $\sigma_{xx}$, $\sigma_{yy}$ and $\sigma_{zz}$ are the induced stress components along three principal axes of the motor element. The constants a and b are used to control the lateral contraction and expansion of the element for volume conservation. For simplicity, shearing is ignored in the motor element in this example.

The Jacobian matrix has the following terms:

$$\frac{\partial \Delta\sigma_{xx}}{\partial \Delta\epsilon_{xx}} = \frac{\partial \Delta\sigma_{yy}}{\partial \Delta\epsilon_{yy}} = \frac{\partial \Delta\sigma_{zz}}{\partial \Delta\epsilon_{zz}} = 1 \quad (5)$$

$$\frac{\partial \Delta\sigma_{xx}}{\partial \Delta\epsilon_{yy}} = \frac{\partial \Delta\sigma_{xx}}{\partial \Delta\epsilon_{zz}} = \frac{\partial \Delta\sigma_{yy}}{\partial \Delta\epsilon_{zz}} = 0 \quad (6)$$

$$\frac{\partial \Delta\sigma_{xy}}{\partial \Delta\epsilon_{xy}} = \frac{\partial \Delta\sigma_{xz}}{\partial \Delta\epsilon_{xz}} = \frac{\partial \Delta\sigma_{yz}}{\partial \Delta\epsilon_{yz}} = 0 \quad (7)$$

Suppose the muscle-tendon complex has material properties listed in Table 1.

TABLE 1

| | MOTOR ELEMENT | |
|---|---|---|
| 1 | Strain rate, c | −0.5 to +0.5 s$^{-1}$ |
| 2 | Time period, t | 2 seconds |
| 3 | Material constants, a or b | 0.4 c |
| | COMBINED VISCOELASTIC ELEMENT | |
| 1 | Young's modulus, E | 5 MPa |
| 2 | Poisson's ratio, v | 0.48 |
| 3 | Maximum number of terms in the Prony series, n | 1 |
| 2 | The modulus ratio in the first term in the Prony series expansion of the shear relaxation modulus, $\bar{g}_1^r$ | 0.5 |
| 3 | The modulus ratio in the first term in the Prony series expansion of the bulk relaxation modulus, $\bar{k}_1^r$ | 0.5 |
| 4 | The relaxation time for the first term in the Prony series expansion, $t_1^G$ or $t_1^K$ | 0.8 seconds |
| | TENDON | |
| 1 | Young's modulus, E | 1 MPa |
| 2 | Poisson's ratio, v | 0.3 |

Figure 2:
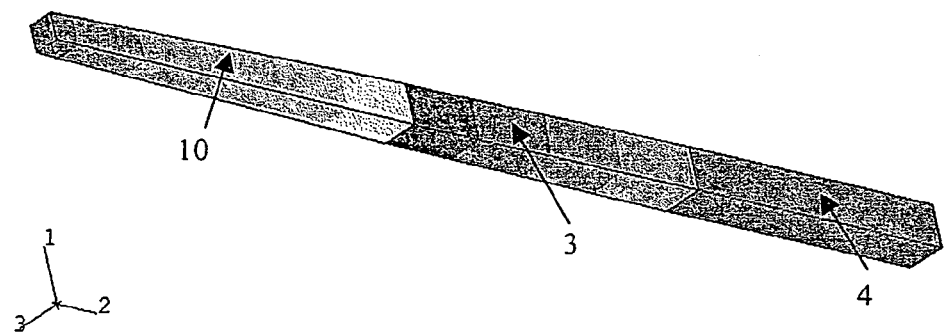
FIG. 2 illustrates the stress distribution in the muscle-tendon complex induced by the extension of the motor element at a positive strain rate, $c=0.25$ $s^{-1}$ in two seconds.

As both ends of the muscle-tendon complex have been constrained in the y-direction, this means that the combined viscoleastic element and the tendon have to retract in response to a strain generated by the extension of the motor element at a positive strain rate (say c=−0.25 s$^{-1}$). As the elastic modulus of the combined viscoelastic element is set to be greater than that of the tendon, the former retracts less than the latter as in FIG. 2. With the opposition from these two elements, the extension of the motor element becomes much less than that can be induced by only one motor element. Therefore, a highest compressive stress in the y-direction is induced in the region connected to the combined viscoelastic element as in FIG. 2.

Figure 3:
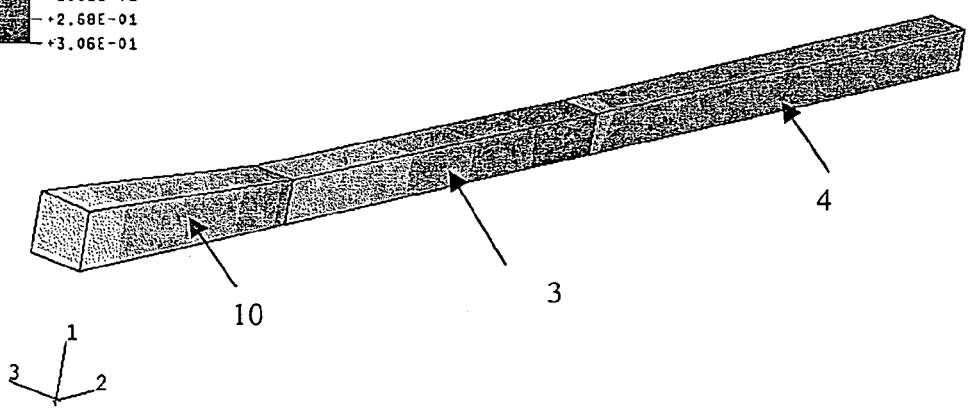
FIG. 3 illustrates the stress distribution in the muscle-tendon complex induced by the contraction of the motor element at a negative strain rate, $c=-0.25$ $s^{-1}$ in two seconds.
Figure 4:
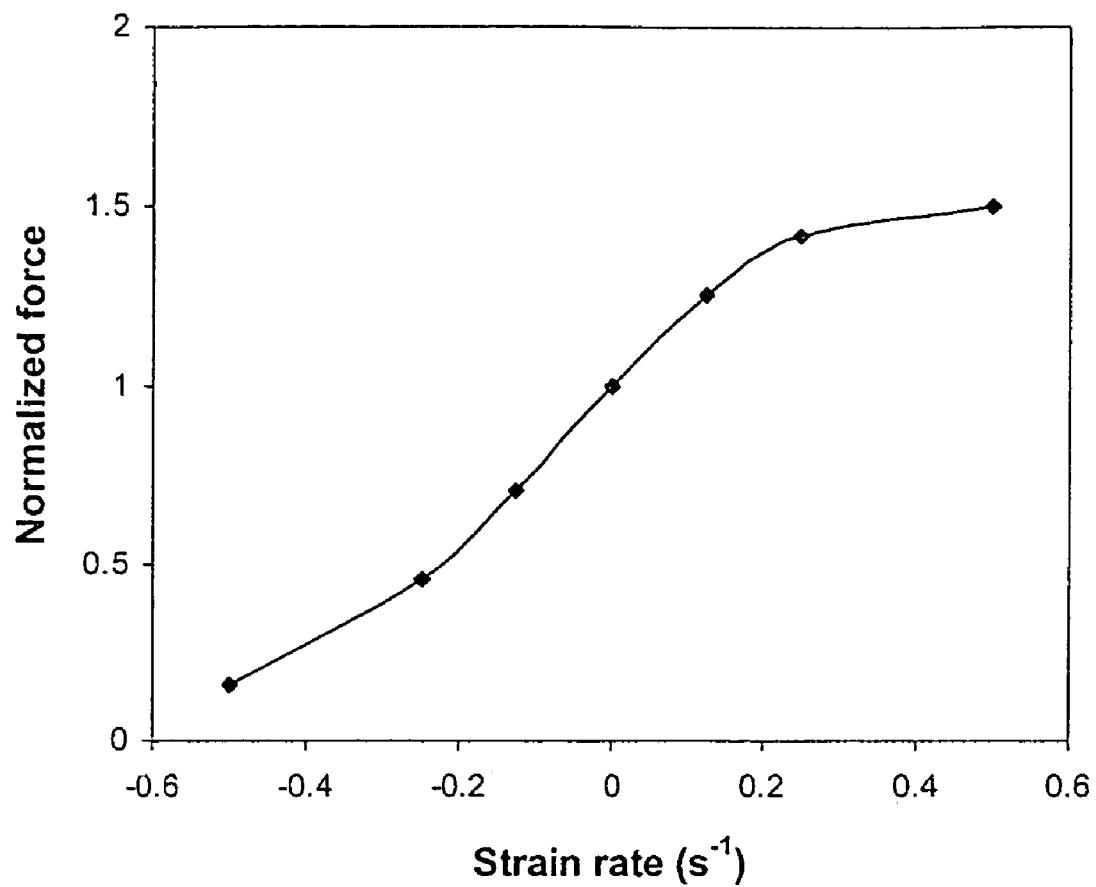
FIG. 4 shows normalized force at the fixed end of the spring element versus strain rate Table 1 shows the material parameters for the muscle-tendon complex.

When the strain rate of the motor element is changed from a positive to a negative value, the motor element retracts while the combined viscoelastic element and the tendon extend as in FIG. 3. The deformed motor element is no longer a rectangle but it expands much greater at its fixed end. It is because the motor element is only fixed at the y-direction while it can freely move at the x and y directions. Again, the distance extended by the combined viscoelastic element is less than that moved by the tendon. As the stiffness of the combined viscoelastic element is greater than that of the motor element, the retracting distance of the motor element shown in FIG. 3 becomes much less than that can be induced by only one motor element. This induces a highest tension force at the fixed end of the motor element in the y-direction as in FIG. 3. The normalized force is measured at the fixed end of the tendon. Its relation with the strain rate is plotted in FIG. 4.

The invention claimed is:

1. A method of modeling muscular tissue with active finite elements, the method comprising:

constructing a plurality of active finite elements, each active finite element including a motor element and at least one passive element connected to and interacting with the motor element, the at least one passive element being selected from the group consisting of dashpot elements and spring elements;

constructing a model of muscular tissue comprising the plurality of the active finite elements, with the plurality of active finite elements interconnected; and analyzing the model to predict movement and interaction of the muscular tissue.

2. The method of claim 1 wherein said active finite elements are one-dimensional.

3. The method of claim 1 wherein said active finite elements are at least one of linear, triangular, rectangular, quadrilateral, pentagonal, hexagonal, octagonal, decagonal, polygonal, tetrahedral, pentahedral, hexahedral, octahedral, decahedral, and polyhedral.

4. The method of claim 1 wherein said active finite elements are two-dimensional.

5. The method of claim 1 wherein said active finite elements are three-dimensional.

* * * * *